United States Patent
Jussila et al.

(10) Patent No.: US 10,979,086 B2
(45) Date of Patent: Apr. 13, 2021

(54) MULTI-BAND RADIO RECEIVERS

(71) Applicant: Nordic Semiconductor ASA, Trondheim (NO)

(72) Inventors: Jarkko Jussila, Trondheim (NO); Pete Sivonen, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 16/762,106

(22) PCT Filed: Nov. 1, 2018

(86) PCT No.: PCT/GB2018/053181
§ 371 (c)(1),
(2) Date: May 6, 2020

(87) PCT Pub. No.: WO2019/092403
PCT Pub. Date: May 16, 2019

(65) Prior Publication Data
US 2020/0358461 A1    Nov. 12, 2020

(30) Foreign Application Priority Data

Nov. 7, 2017  (GB) .................................... 1718411

(51) Int. Cl.
*H04B 1/00*        (2006.01)
*H04B 1/10*        (2006.01)
(Continued)

(52) U.S. Cl.
CPC ........... *H04B 1/005* (2013.01); *H04B 1/1036* (2013.01); *H04B 2001/1063* (2013.01)

(58) Field of Classification Search
None
See application file for complete search history.

(56) References Cited

U.S. PATENT DOCUMENTS 5,054,117 A    10/1991  Cruz et al.
6,020,783 A *   2/2000  Coppola ................ H03D 7/161
                                                    327/552
(Continued)

FOREIGN PATENT DOCUMENTS

EP        1 760 893 A2      3/2007
WO    WO 2010/000690 A1    1/2010
WO    WO 2016/060810 A1    4/2016

OTHER PUBLICATIONS

International Search Report and Written Opinion of the International Searching Authority for PCT/GB2018/053181, dated Feb. 25, 2019, 13 pages.
(Continued)

*Primary Examiner* — Pablo N Tran
(74) *Attorney, Agent, or Firm* — Klarquist Sparkman, LLP

(57) ABSTRACT

A radio frequency receiver is provided that comprises an antenna, an RF amplifier, at least one down conversion mixer stage and a variable notch filter. The at least one down-conversion mixer stage is arranged to act on signals provided by the RF amplifier and is tuned to a tuned frequency ft which is selected from a plurality of possible tuned frequencies corresponding to a frequency of the RF signal to be received at the antenna. The variable notch filter is arranged to act on signals passing from the antenna to the RF amplifier and has a resonance frequency $f_r$ which is selected from a plurality of possible resonance frequencies such that $f_r = f_t/n$ where n is a whole number between 2 and 10. The variable notch filter thereby acts to attenuate signals from the antenna at said resonance frequency.

14 Claims, 8 Drawing Sheets

(51) Int. Cl.
  *H04W 24/00* (2009.01)
  *H04W 92/10* (2009.01)

(56) References Cited

U.S. PATENT DOCUMENTS

| | | | | |
|---|---|---|---|---|
| 6,636,128 | B2* | 10/2003 | Rauscher | H03H 7/0123 |
| | | | | 333/174 |
| 7,142,833 | B2* | 11/2006 | Hibino | H03F 1/565 |
| | | | | 455/193.1 |
| 7,266,360 | B2* | 9/2007 | Kang | H04B 1/28 |
| | | | | 330/131 |
| 7,999,608 | B1* | 8/2011 | Groe | H03H 7/03 |
| | | | | 327/556 |
| 9,118,396 | B2* | 8/2015 | Gudem | H04B 1/44 |
| 9,166,636 | B2* | 10/2015 | McCullagh | H04B 1/525 |
| 2003/0216122 | A1* | 11/2003 | Cordone | H04B 1/71 |
| | | | | 455/63.1 |
| 2008/0139149 | A1* | 6/2008 | Mu | H03D 7/165 |
| | | | | 455/200.1 |
| 2009/0280766 | A1 | 11/2009 | Rofougaran et al. | |
| 2010/0136942 | A1* | 6/2010 | Lee | H04B 1/18 |
| | | | | 455/334 |
| 2011/0151819 | A1 | 6/2011 | Dickey et al. | |
| 2011/0212698 | A1 | 9/2011 | Le Guillou et al. | |
| 2012/0302188 | A1 | 11/2012 | Sahota et al. | |
| 2014/0347142 | A1 | 11/2014 | Chang et al. | |
| 2017/0026031 | A1 | 1/2017 | Levesque | |

OTHER PUBLICATIONS

IPO Search Report under Section 17(5) for GB1718411.0, dated May 3, 2018, 4 pages.

Infineon Technologies AG, "IMD Performance of BGA925L6 with Different Application Circuits under Specific Test Conditions," Aug. 11, 2011, 24 pages.

Zhang et al., "Linearization Techniques for CMOS Low Noise Amplifiers: A Tutorial," *IEEE Transaction on Circuits and Systems-1: Regular Papers*, vol. 58, No. 1, Jan. 2011, pp. 22-36.

3GPP, "The Mobile Broadband Standard," Release 13, Oct. 9, 2015, 2 pages.

* cited by examiner

MULTI-BAND RADIO RECEIVERS

CROSS REFERENCE TO RELATED APPLICATIONS

This is the U.S. National Stage of International Application No. PCT/GB2018/053181, filed Nov. 1, 2018, which was published in English under PCT Article 21(2), which in turn claims the benefit of Great Britain Application No. 1718411.0, filed Nov. 7, 2017.

This invention relates to radio frequency (RF) receivers, particularly those incorporated into radio frequency integrated circuits (RFICs).

Modern RF transceivers employed in wireless communication devices, such as cellular phones, tablets, and laptops, are usually highly integrated—with most of the transceiver circuits and blocks integrated on a radio frequency integrated circuit (RFIC). In order to maximize the level of integration, the RF receiver can be implemented as a direct conversion receiver which makes efficient use of area on the silicon. Such a known direct conversion (or zero intermediate frequency) receiver is typically provided with an RF filter preceding the low noise amplifier (LNA). This filter, known as an 'RF pre-selection filter' filters and attenuates harmful out-of-band blocking signals, which can drive the receiver into compression. Blocking signals may also desensitize the receiver and lower the signal-to-noise-ratio (SNR) of the desired received RF signal.

An RF pre-selection filter is only capable of being used for a single frequency band. If support for multiple frequency-bands support is needed, multiple RF pre-selection filters and corresponding LNAs are also needed. However as the RF pre-selection filters are typically expensive external (off-chip) components and the additional LNAs—each tuned to a respective frequency band—require more area on the silicon, such multi-band radio receivers tend to be bulky and expensive.

The Applicant has appreciated that an integrated radio receiver may be realized with sufficiently linearity that out-of-band blocking signals can be tolerated without filtering them before they enter the LNA, thereby allowing the RF pre-selection filter(s) to be omitted. However for multi-band applications, this then implies that a single LNA would need to be able to support multiple frequency bands.

One further significant difficulty appreciated by the Applicant is that even though it may be possible to design an integrated RF receiver with sufficient linearity to tolerate out-of-band blocking signals, significant problems can still arise if blocking signals are present at sub-harmonic frequencies—that is frequencies which are a simple fraction of the desired centre frequency (e.g. ½ or ⅓ of that frequency). The reason for this is that practical amplifiers suffer from second, third and higher order non-linearities which generate frequency components at integer multiples of the input frequency. Clearly such a component at twice the frequency of a ½ sub-harmonic of the desired frequency, or at three times a ⅓ sub-harmonic, would be at the desired frequency itself and therefore interfere with the actual signal of interest, reducing the effective SNR.

Harmonic distortion can be lowered in LNAs by applying one of the many well-known linearization techniques. Unfortunately these techniques generally increase the complexity, power consumption, and noise figure (NF) of the LNA. In addition, some of the linearization techniques are narrowband, which means they are ill-suited for the realization of a wideband radio receiver without an RF pre-selection filter.

The present invention aims at least to alleviate some of the shortcomings outlined above and provides a radio frequency receiver comprising:
an antenna for receiving an RF signal;
an RF amplifier;
at least one down conversion mixer stage arranged to act on signals provided by the RF amplifier and tuned to a tuned frequency $f_t$ selected from a plurality of possible tuned frequencies, said tuned frequency corresponding to a frequency of the RF signal to be received at the antenna; and
a variable notch filter acting on signals passing from the antenna to the RF amplifier, said variable notch filter having a resonance frequency $f_r$ selected from a plurality of possible resonance frequencies such that $f_r=f_t/n$ where n is a whole number between 2 and 10, the variable notch filter thereby acting to attenuate signals from the antenna at said resonance frequency.

Thus it will be seen by those skilled in the art that in accordance with the present Invention, a variable notch filter is provided which can attenuate sub-harmonics of the desired RF signal in a multi-band receiver. This can lead to significant improvements in the SNR of the desired signal without needing multiple pre-selection filters.

In a set of embodiments the RF amplifier and the down conversion mixer stage are provided on an integrated circuit.

In a set of embodiments the variable notch filter comprises a serial arrangement of an inductance and a capacitance, said serial arrangement being connected between said signal from the antenna and a ground. In a sub-set of embodiments in which the amplifier and the frequency down-converter stage are provided on an integrated circuit, the capacitance is also provided on the integrated circuit and the inductance is provided externally of the integrated circuit.

In a set of preferred embodiments the capacitance is variable in order to provide the variation in resonance frequency set out above. A number of ways in which this is achieved can be envisaged—e.g. using a varactor—but in a set of embodiments the capacitance comprises a plurality of discrete capacitor elements, at least some of which can be selectively switched into and out of series with the inductance.

The capacitor elements could have the same nominal value and be arranged in parallel to give an overall capacitance equal to a multiple of the nominal value dependent on the number of capacitor elements switched into series with the inductance. Alternatively the capacitor elements could simply represent the different capacitance values required and only one of them be switched into circuit at a time.

In a set of preferred embodiments however the capacitor elements have different values and are arranged in parallel such that they can be selectively switched into series with the inductance to give an aggregate capacitance value equal to the sum of the capacitance values of those switched into series. The values of the capacitor elements can then be chosen so that combinations thereof provide the required aggregate capacitance value. A particularly convenient example of such embodiments is for the capacitor elements to have values which are power-of-two multiples of a base value. This then allows integer multiples of the base value to be achieved using a capacitance 'word' of the appropriate number of bits (equal to the number of such capacitor elements) in length.

In any of the arrangements set out above a fixed capacitor may be provided—e.g. in parallel with the capacitor elements—to provide a base capacitance value.

The down-conversion mixer stage is arranged to convert a radio frequency input signal to a baseband frequency signal. In a set of embodiments the down conversion mixer stage is arranged to convert a radio frequency input directly to a baseband frequency—i.e. it is a zero-IF conversion stage. In such embodiments the down conversion mixer stage would be driven by a local oscillator operating at the tuned frequency.

The invention is also applicable to other radio architectures—e.g. having a non-zero intermediate frequency, in which case the down conversion mixer stage would be driven by a local oscillator whose frequency does not equal the tuned frequency but which has a relationship to it.

In a set of embodiments the amplifier comprises a low noise amplifier. Such amplifiers are well known in the art per se and are typically used at the front end of a radio receiver and thus operate at radio frequency.

The amplifier could be a single-ended amplifier, but in a set of embodiments the amplifier has a differential input. Additionally or alternatively the amplifier may have a differential output.

In a set of embodiments the radio receiver is arranged to be tuneable within a frequency range having a lower end of between 100 and 2000 MHz e.g. between 500 and 1800 MHz. In a set of embodiments the radio receiver is arranged to be tuneable within a frequency range having an upper end of between 1000 and 5000 MHz e.g. between 1500 and 3000 MHz. To take a specific example the radio receiver may be arranged to be tuneable from 1800-2700 MHz.

In a set of embodiments the radio receiver is arranged to receive and decode signals conforming to at least one version of the Long Term Evolution (LTE) cellular radio standard. In one example the radio receiver is arranged to be compatible with "NarrowBand IoT" (NB-IoT), sometimes referred to as "LTE Cat NB1" and/or "enhanced Machine Type Communication" (eMTC) as specified in Release 13 of the LTE standard, Certain embodiments of the present invention will now be described, by way of example only, with reference to the accompanying drawings in which.

Figure 1:
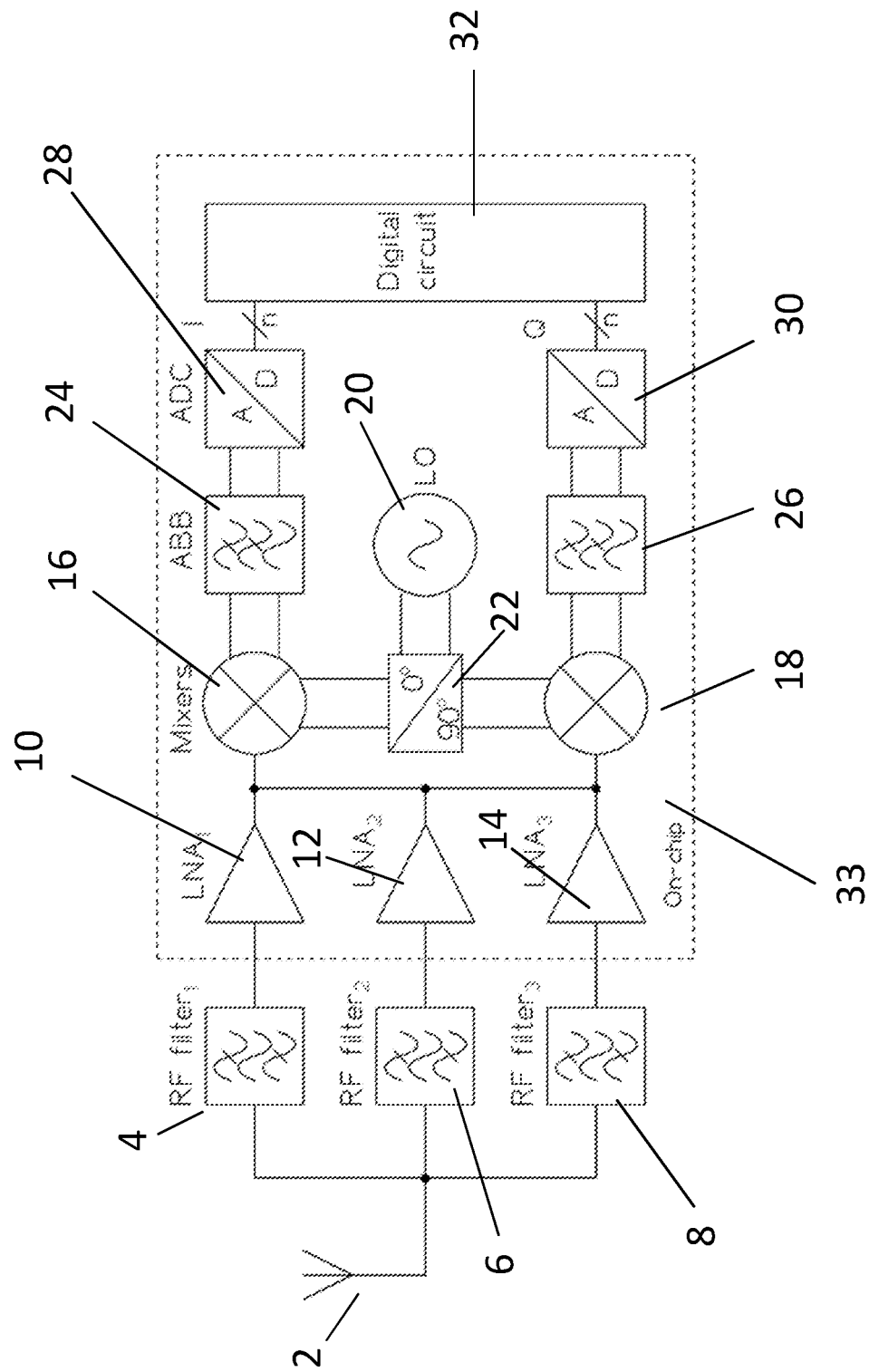
FIG. 1 is a schematic diagram of a typical prior art multi-band receiver architecture.

FIG. 1 shows a known arrangement of a multi-band direct conversion (zero IF) radio receiver. This comprises an antenna 2 which is connected to three radio frequency (RF) pre-selection filters 4, 6, 8 relating to a respective one of three bands. Each of these is connected to a respective corresponding low noise amplifier (LNA) 10, 12, 14.

The outputs of the LNAs 10, 12, 14 are each fed to two parallel down-conversion mixers 16, 18. One of the mixers 16, mixes the RF signal with a signal derived from a local oscillator 20 operating at a variable frequency corresponding to one of three respective bands to which the receiver can be tuned. These correspond to the respective pass bands of the pre-selection filters 4, 6, 8. It will be appreciated of course that the oscillator may operate at, say twice the required frequency and then pass through a divide-by-two module to produce the signal which drives the mixers. This produces an in-phase (I) baseband signal and the other mixer 18, mixes the RF signal with a 90 degree phase-shifted version of the signal generated by a local oscillator 20, produced by a phase shifter 22, to produce a quadrature (Q) baseband signal. As is well-known in the art, the I and Q signals are passed through respective low-pass filters 24, 26 and analog-to-digital converters (ADCs) 28, 30 for digital processing by the digital part of the radio receiver 32.

The majority of the components are provided on a common integrated circuit or 'chip' 33 whilst the antenna 2 and RF pre-selection filters 4, 6, 8 are provided externally of the chip 33 and connected to it by pins—i.e. they are 'off chip'.

In this arrangement the off-chip RF pre-selection filters 4, 6, 8 attenuate harmful out-of-band blocking signals for their respective bands. As previously discussed, this reduces the risk of such blocking signals driving the receiver into compression or desensitizing the receiver and giving a lower signal-to-noise ratio (SNR) in respect of the wanted signal. However, this carries significant cost and complexity.

Figure 2:
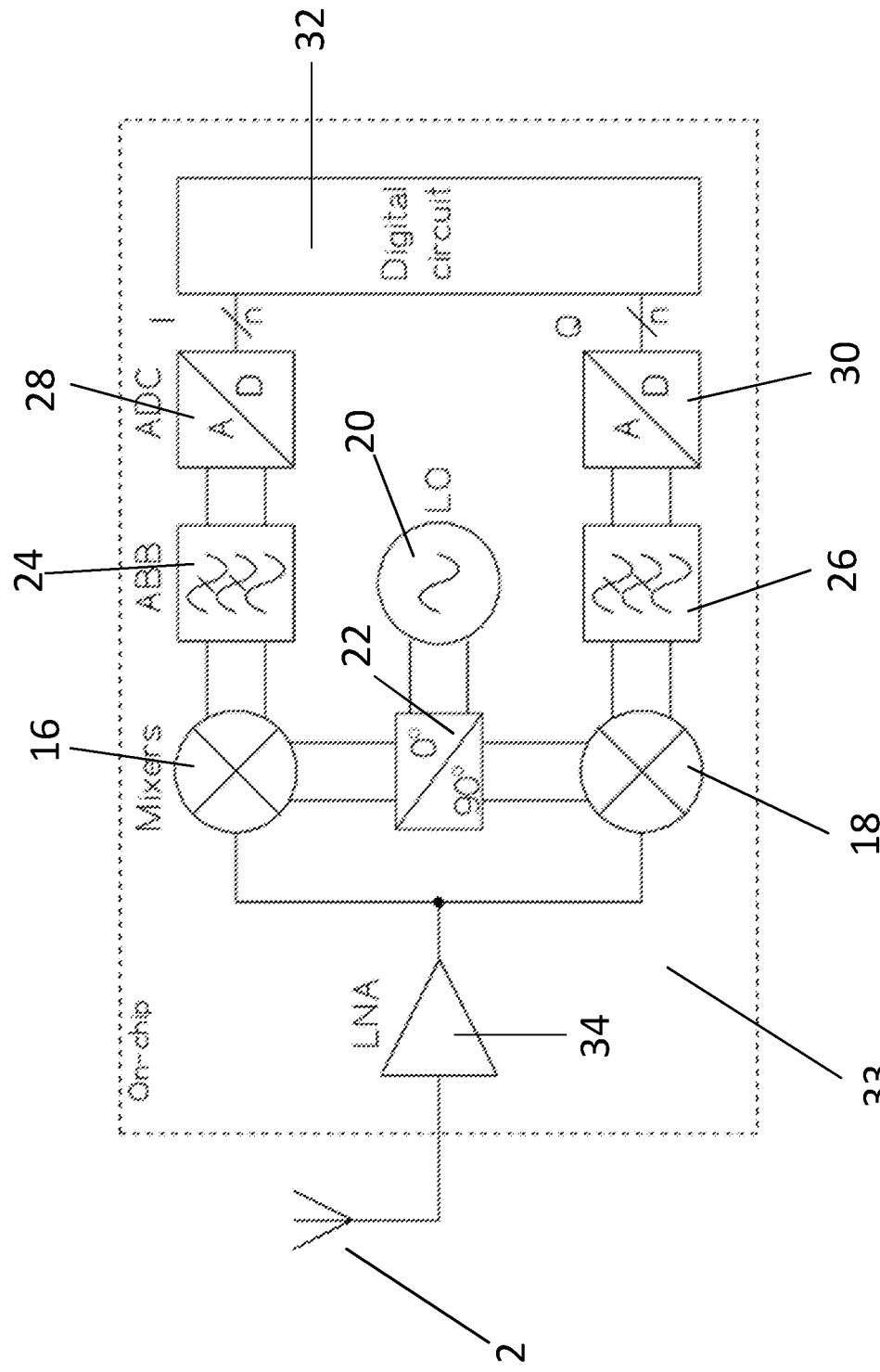
FIG. 2 is a schematic diagram of another possible multi-band receiver architecture shown for reference purposes only.

FIG. 2 shows a possible alternative to the arrangement shown in FIG. 1. Like components are indicated with the same reference numerals. The difference in this arrangement is that it does not have separate RF pre-selection filters and LNAs. Instead the antenna 2 feeds a single, high linearity LNA 34 which may be able to tolerate out-of-band blocking signals which have not been filtered out before they reach the LNA.

Even though the radio receiver shown in FIG. 2 could be designed to be tolerant of blocking signals, the blocking signals situated at sub-harmonic frequencies of the desired RF signal may prove to be very problematic. Sub-harmonic frequency blockers are situated at frequencies $f_{BL,SH}$, which relate to the desired RF signal ($f_{RX}$) in the following way $$f_{BL,SH} = \frac{f_{RX}}{n} \quad \text{(Eq. 1)}$$

Where n is a small integer—i.e n=2, 3, 4 etc

The reason why sub-harmonic frequency blockers can be troublesome, can be seen by approximating the LNA input/output characteristic as:

$$y(t) \approx \alpha_1 x(t) + \alpha_2 x^2(t) + \alpha_3 x^3(t) \ldots + \alpha_n x^n(t) \quad \text{(Eq. 2)}$$

Now, if a sub-harmonic blocker $x(t)=A_{BL,SH} \cos(\omega_{BL,SH} t)$ appears at the LNA input, the LNA, modelled as a nonlinear system given by Eq. 2, will generate frequency components that are integer multiples (harmonics) of the input frequency ($f_{BL,SH}$). More precisely, an $n^{th}$-order nonlinearity in the LNA will generate a harmonic distortion component whose output amplitude grows in proportion to $A^n$ and which appears at the LNA output at the frequency of $nf_{BL,SH}$. In other words, the $n^{th}$-order non-linearity creates a harmonic distortion component at the frequency of $nf_{BL,SH}=nf_{RX}/n=f_{RX}$ which thus coincides with desired RF signal frequency. As a result, the blocking signal appearing at the sub-harmonic frequency of the desired RF signal can severely degrade the SNR of the desired RF signal. The SNR can be degraded because of the harmonic distortion component at $f_{RX}$ even if the receiver was not compressed by the blocking signal at $f_{BL,SH}$.

For example, the second-order nonlinearity in an LNA generates a harmonic distortion component which appears at the LNA output at $2f_{BL,SH}$ and whose amplitude grows in proportion to $A^2$. Correspondingly, the LNA third-order nonlinearity creates a harmonic distortion component which appears at the LNA output at $3f_{BL,SH}$ and whose amplitude grows in proportion to $A^3$.

Figure 3:
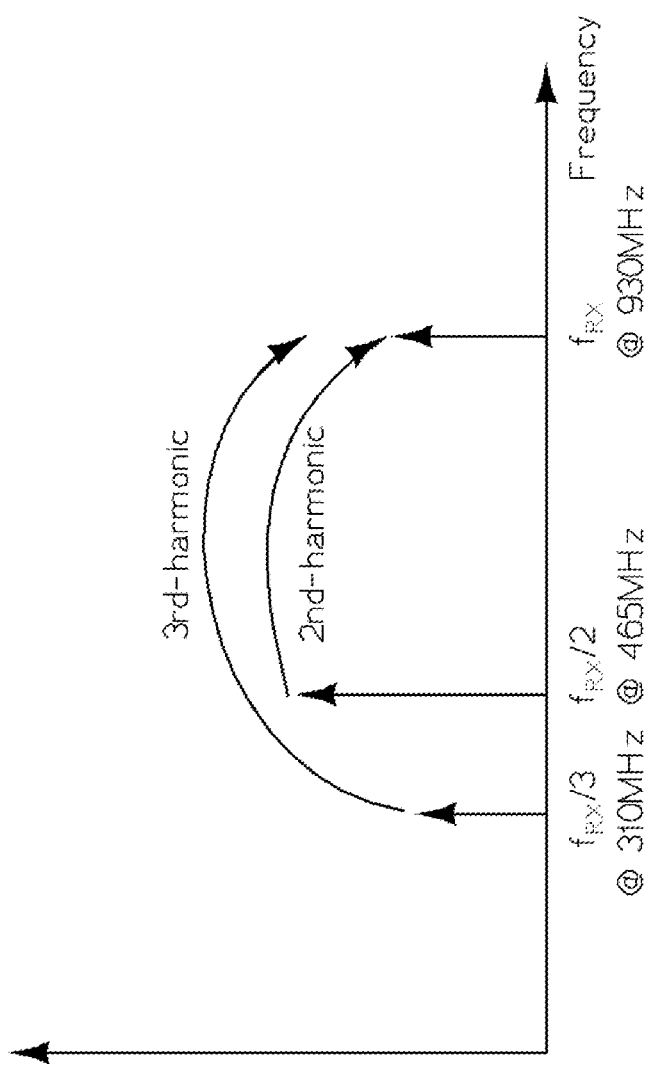
FIG. 3 is a diagram illustrating sub-harmonic blocking signals.

The phenomenon described above is illustrated in FIG. 3 using the example of a Long Term Evolution (LTE) receiver operating in band eight (925-960 MHz). If such a receiver is tuned to receive, for example, at 930 MHz, sub-harmonic frequency blockers appearing at 465 MHz and 310 MHz can severely degrade the SNR of the desired signal via LNA second- and third-order nonlinearity, respectively.

In practice, usually the sub-harmonic frequency blocking signals located at $f_{RX}/2$ and $f_{RX}/3$ are the most problematic, since the higher-order harmonics (i.e. fourth and higher) are at much lower levels at the LNA output. In other words, usually the second- and third-order nonlinearity dominate the LNA harmonic distortion. In addition, fourth- and higher-order harmonics are usually located at sufficiently low frequencies that they are attenuated already at the LNA input circuit before they create harmful harmonic distortion. Also, they are situated far away from the desired RF signal.

In radio receivers employing RF pre-selection filters such as that shown in FIG. 1, sub-harmonic frequency blocking signals are usually of less concern. This is because the RF pre-selection filters 4, 6, 8 are typically realized as band-pass filters, which attenuate out-of-band signals below the desired frequency band as well as above it. As a result, harmful sub-harmonic frequency blockers are usually sufficiently attenuated before they enter the LNA 10, 12, 14. Therefore, the resulting harmonic distortion at $f_{RX}$ is so small that it does not have a practical effect on the SNR.

By contrast, in a radio receiver without an RF preselection filter such as that shown in FIG. 2, sub-harmonic frequency blocking signals experience no filtering and thus practically no attenuation before they enter the LNA 34. As a result, especially the blocking signals at $f_{RX}/2$ and $f_{RX}/3$ can be very troublesome as they harm the reception of the desired RF signal by generating harmonic distortion components at $f_{RX}$.

Figure 4:
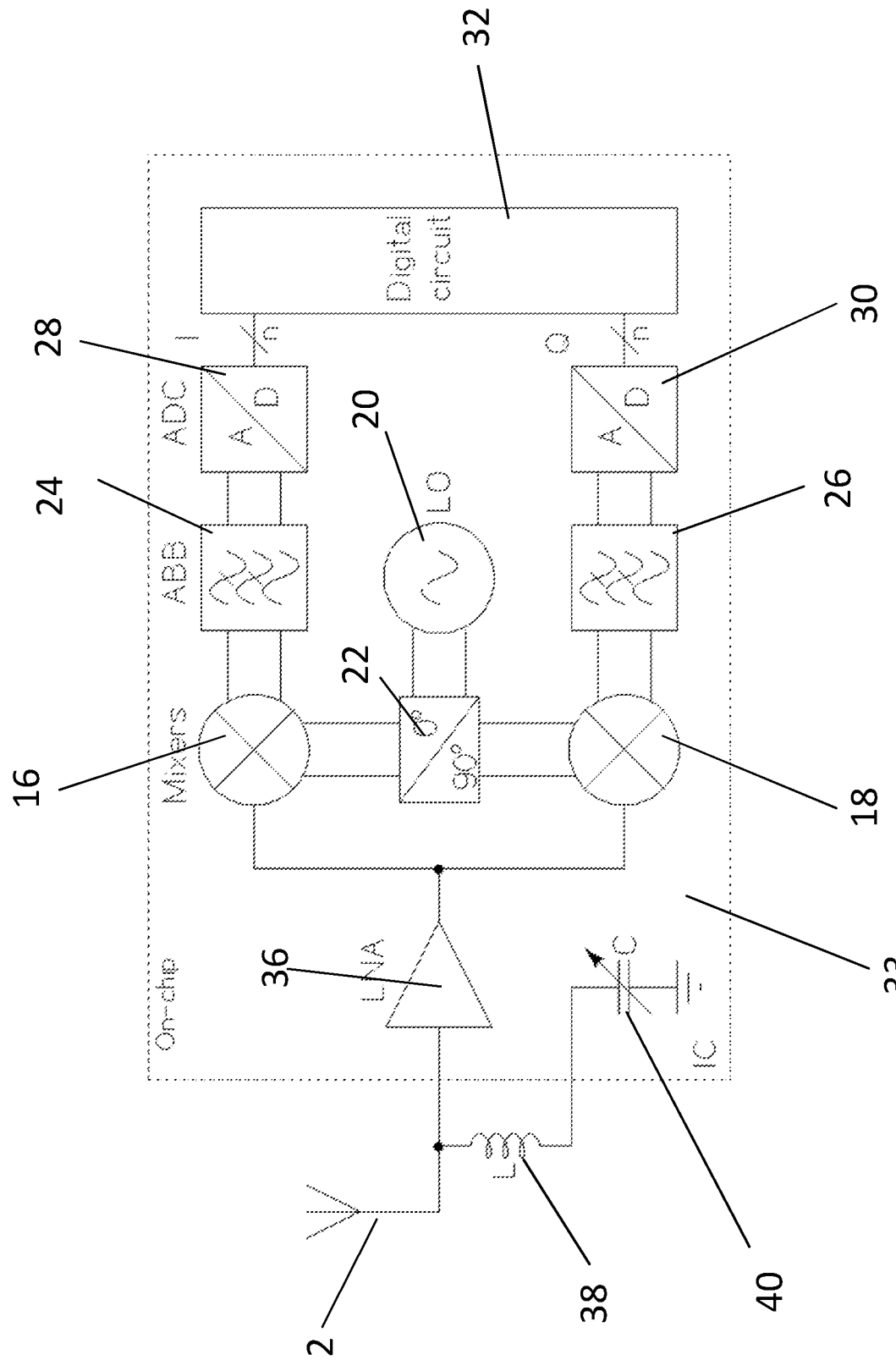
FIG. 4 is a schematic diagram of a multi-band receiver architecture in accordance with an embodiment of the invention.

FIG. 4 shows schematically the architecture of a radio receiver in accordance with an embodiment of the present invention. This may, for example, be configured to receive LTE radio signals. It will be seen that the baseband analog portion 16-30 and the digital portion 32 are represented identically to those of the receivers shown in FIGS. 1 and 2. In common with FIG. 2 there is a single LNA 36. However in respect of sub-harmonic blockers, this does not need extra linearization as will become apparent below. More significantly, this embodiment of the invention differs from the architectures previously described in that it has a variable LC notch filter in parallel with the input of the LNA 36. The variable LC notch filter comprises a fixed inductor 38 located off the chip 33 and a variable capacitor 40 located on the chip. This could be a varactor diode but a more preferred arrangement will be described later with reference to FIG. 5.

The inductor 38 is provided off-chip, since on-chip integrated inductors tend to suffer from much higher loss compared to external inductors. Low loss may be important in order to maximize the notch attenuation at blocker frequencies and to minimize the LNA noise factor degradation due to the notch 38, 40.

This arrangement requires one additional package pin for the capacitor 40. The capacitor 40 can share the ground pin(s) of the LNA 36.

As discussed previously, usually the most problematic sub-harmonic blockers are located at $f_{RX}/2$ and $f_{RX}/3$. The Applicant has appreciated that it may be adequate to provide sufficient attenuation for just one of these rather than both of them. The notch filter 38, 40 mentioned above provides attenuation at one of the sub-harmonic blocking frequencies for the band to which the radio receiver is currently tuned. If it is tuned to a different band, the capacitance of the variable capacitor 40 is changed to change the notch frequency accordingly.

Analysing this in more detail and neglecting all losses in the LC-notch 38, 40, the impedance looking into the LC-notch is given as $$Z_{LC-NOTCH}(\omega) = j\omega L + \frac{1}{j\omega C} \qquad \text{(Eq. 3)}$$

Where L is the inductance of the inductor 38 and C is the present value of the capacitance 40.

It is assumed for the analysis below that the notch is designed to provide series resonance at $f_{BL,SH}=f_{RX}/2$. In some cases though, the sub-harmonic blocking signal at $f_{BL,SH}=f_{RX}/3$ is more severe and then for a given desired RF band ($f_{RX}$), the LC-notch would be configured to $f_{BL,SH}=f_{RX}/3$.

The value C of the capacitance 40 is chosen, in light of the fixed value L of the inductor 38, such that they provide resonance at the sub-harmonic blocker:

$$\omega^2_{BL,SH} = \frac{1}{LC} \qquad \text{(Eq. 4)}$$

At this particular frequency $$Z_{LC-NOTCH}(\omega_{BL,SH})=0 \qquad \text{(Eq. 5)}$$

As a result, harmful blocking signal currents at $f_{BL,SH}=f_{RX}/2$ are filtered to ground and they do not (in theory) appear at all at the input to the LNA 36. In other words, the series LC-notch 38, 40 provides a low impedance between the input of the LNA 36 and ground at the resonance frequency. In practice, losses in the notch 38, 40 may cause a residual blocker signal to be present at the input to the LNA 36.

At the desired RF frequency, the impedance of the LC-notch 38, 40 is given as $$Z_{LC-NOTCH}(\omega_{RF}) = j\omega_{RF}\frac{3L}{4} \qquad \text{(Eq. 6)}$$

combining Eq. 4 and the relation $f_{RX}=2f_{BL,SH}$. Thus at the desired RF frequency, the notch appears as an inductance, having a value of 3 L/4.

As shown by Eq. 4, the resonance frequency of the LC-notch 38, 40 can be configured by either adjusting the value of inductance L or capacitance C. The embodiments shown herein utilise adjustment of the capacitance C as adjusting the value of inductance is more difficult in practice. Moreover, adjusting the notch capacitance can be accomplished on-chip.

In most cases, the bandwidth of a downlink band in LTE is much smaller than the center frequency of the band such that the attenuation provided by the notch filter with one control setting, i.e. one capacitance value, is sufficient for the entire downlink band. An example of this is LTE band 13, where the downlink band is 746-756 MHz. There are, however, a few exceptions that have a wide downlink band compared to the center frequency, for example band 44, where the downlink band is 703-803 MHz. In such a case, different capacitance values can be used in different parts of the band. In typical embodiments of the invention each supported receive frequency or band will be provided with a dedicated capacitance value in the configurable LC-notch filter.

Variation of inductance of off-chip inductors is usually much smaller than the variation of capacitance of on-chip capacitors, which means that the capacitance variation dominates the variation of notch frequency. This means that if the actual capacitance value of the on-chip capacitor is measured with a separate circuit block, the measurement result can be utilized by selecting a capacitor matrix control code which compensates for the variation of capacitance by utilizing the measurement result. This results in significantly smaller variation of notch frequency and, therefore, higher attenuation can be achieved for sub-harmonic blocker in the presence of component variations in the notch filter.

A further, preferred embodiment of the invention will now be described with reference to FIG. 5. This shows a capacitor matrix 42 which is used to provide the variable capacitance value. The capacitor matrix 42 employs the principle that the total capacitance of two capacitors connected in parallel is the sum of their capacitances. This allows the capacitance C of the notch filter to be adjusted in discrete steps.

Figure 5:
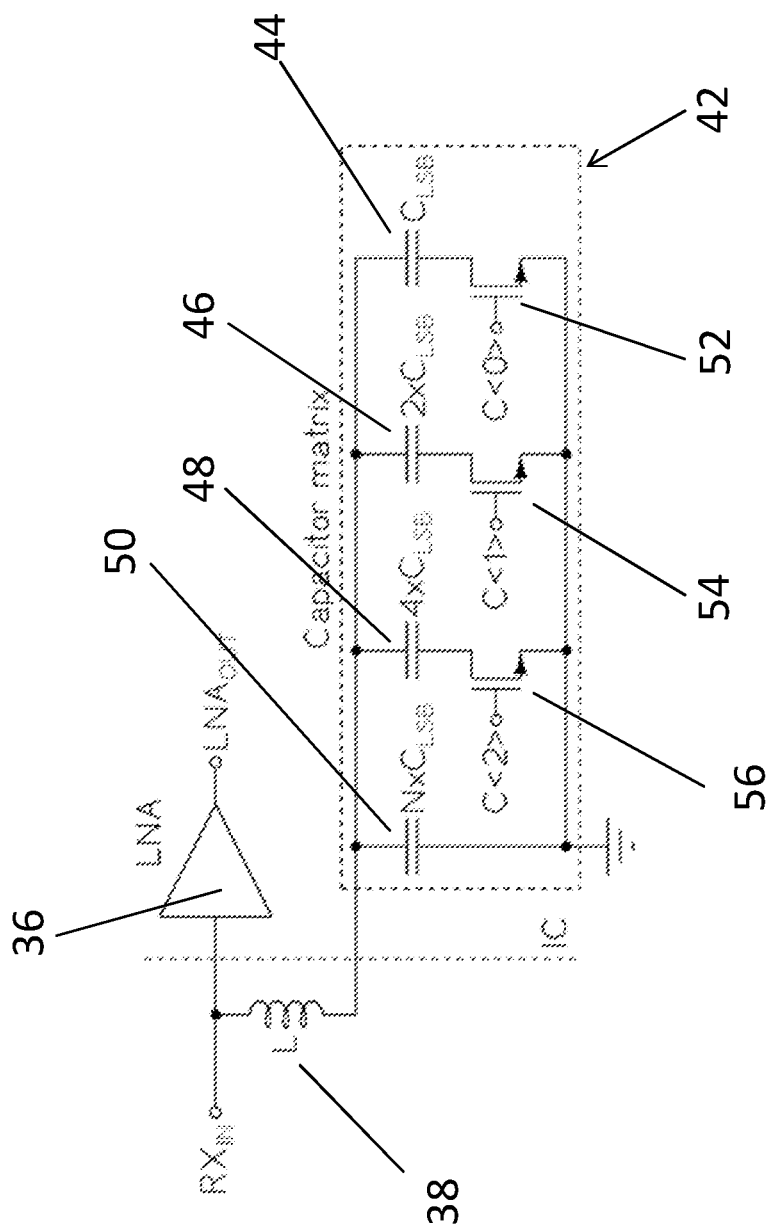
FIG. 5 is a schematic diagram of a variable notch filter in accordance with a second embodiment of the invention.

The capacitor matrix 42 shown in FIG. 5 has four separate capacitors 44, 46, 48, 50. Three of the capacitors 44, 46, 48 are controlled by respective NMOS transistors 52, 54, 56 so that they can be switched in and out of parallel with the fixed capacitor 50. It will be seen therefore that the total capacitance C will be a sum of the value of the fixed capacitor 50 and whichever of the switched capacitors 44, 46, 48 is switched on.

The values of the capacitors 44-50 are selected so that the total capacitance can be easily increased in equal steps above a base level using a binary control word. The rightmost capacitor 44 is given a certain value $C_{LSB}$ where 'LSB' indicates that it corresponds to the least significant bit of the control word. The next capacitor 46 has a value of $2C_{LSB}$ and the third a value of $4C_{LSB}$. The fixed capacitor 50 has a capacitance of $NC_{LSB}$. Thus all the capacitors 44-50 are implemented as multiple units of $C_{LSB}$. In use the capacitor matrix 42 is controlled by a three bit control word (C<2:0>) applied to the respective gates of the transistors 52, 54, 56. The capacitor matrix 42 shown as an example in FIG. 5 allows eight different values for notch capacitance and accordingly, eight different values can be set for notch resonance frequency. For example, when all controls bits are high (C<2:0>='111'), all three control NMOS switches 52, 54, 56 are conducting and the total notch capacitance is $C=(7+N)C_{LSB}$. This corresponds to the lowest notch resonance frequency. On the other hand, for instance when all controls bits are low (C<2:0>='000'), all three control NMOS switches 52, 54, 56 are non-conducting and the total notch capacitance is $C=NC_{LSB}$. With this setting, the highest notch resonance frequency is achieved.

It will be appreciated by those skilled in the art that the capacitor matrix is merely exemplary and could be altered—e.g. to provide more capacitors and thus more available capacitance values (and hence attenuation frequencies). Furthermore whilst it is convenient to have the values as power-of-two multiples of a smallest step capacitance ($C_{LSB}$), this is not essential.

The embodiment of FIG. 5 shows an LNA 36 with a single-ended input and output. Equally however an LNA having a single-ended input and a differential output could be used.

Figure 6:
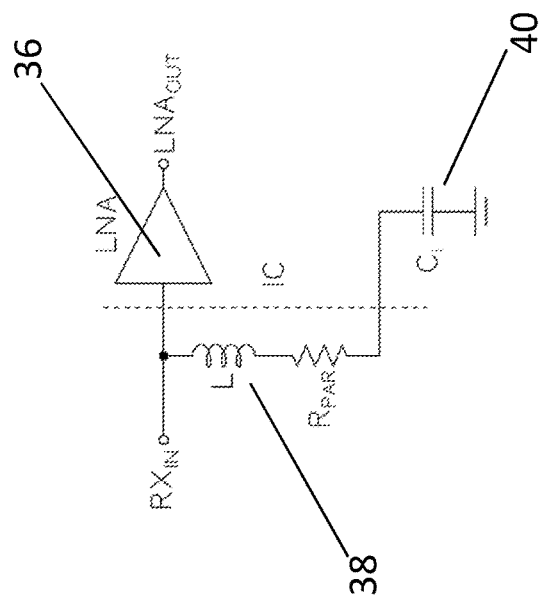
FIG. 6 illustrates a hypothetical consideration of losses in the notch filter.

Referring now to FIG. 6, some consideration is given to the losses which arise in practical implementations of the configurable LC-notch filter 38, 40. These can be treated as lumped into an equivalent resistor in series with the inductor 38 and capacitor 40 and having a value of $R_{PAR}$. In practice, $R_{PAR}$ takes into account, for example, losses in the off-chip inductor 38 (for instance parasitic series resistance associated with inductor windings), losses in the capacitance 40 (for example parasitic access resistance in capacitor units in a capacitor matrix 42), and on-resistance of conducting NMOS switches 52, 54, 56 (whose control voltage at gate is high).

With further reference to FIG. 6, and assuming that the receiver is tuned to receive at $f_{RF1}$, the notch resonance frequency would be set to $f_{BL,SH1}$ by setting the capacitance value to $C_1$ $$\omega_{BL,SH1}^2 = \frac{1}{LC_1} \qquad (Eq.\ 7)$$

Correspondingly, when the receiver is tuned to receive at $f_{RF2}$, the notch resonance frequency is set to $f_{BL,SH2}$ by setting the capacitance value to $C_2$ and so forth $$\omega_{BL,SH2}^2 = \frac{1}{LC_2} \qquad (Eq.\ 8)$$

Next, considering a general case in which the capacitance value is set to C, the receiver is tuned to receive at $f_{RX}$, and it is assumed that the LC-notch filter 38, 40 is set to resonate at the closest sub-harmonic frequency i.e. $f_{BL,SH}=f_{RX}/2$. As discussed above, this is usually the most problematic sub-harmonic frequency.

The component values of the LC-notch filter 38, 40 (L and C) are again chosen to provide series resonance at the sub-harmonic frequency ($f_{BL,SH}=f_{RX}/2$), see Eq. 4 (or Eqs. 7 and 8). Then, the attenuation of the LC-notch filter 38, 40 at the sub-harmonic frequency is given as $$\text{Attenuation}\ (\omega_{BL,SH}) = \frac{R_{PAR}}{R_{PAR} + R_s} \approx \frac{R_{PAR}}{R_s} \qquad (Eq.\ 9)$$

Here, $R_s$ is the antenna or generator resistance (usually 50Ω). It is also assumed that at $f_{BL,SH}$ the LNA 36 input impedance is much larger than $R_{PAR}$ and $R_{PAR} \ll R_s$. It will be appreciated that to maximize the attenuation for the sub-harmonic blocking signal, the losses in the notch filter 38, 40 should ideally be kept as small as possible—i.e. $R_{PAR}$ needs to be minimized. This may be achieved for example by using sufficiently wide NMOS switches 52, 54, 56 in the capacitor matrix 42 so as to lower their on-resistances. In addition, it is preferable for the off-chip inductor 38 to have a large quality factor (Q-factor), e.g. between 30 and 70 since a large inductor Q-factor results in low inductor series resistance.

It has been found that embodiments of the invention can achieve around 20-dB attenuation using the illustrated LC-notch filter 38, 40 for sub-harmonic frequency blockers. Having regard to antenna-referred second-harmonic power due to the LNA 36 (due to the sub-harmonic blocker at $f_{BL,SH}=f_{RX}/2$) this implies around 40-dB improvement. Correspondingly, if the LC-notch is tuned to attenuate a sub-harmonic blocker at $f_{BL,SH}=f_{RX}/3$, around 60-dB lower third-harmonic antenna-referred power due to the LNA 36 can be obtained. In practice, these are huge improvements compared to the performance which might be achieved without the invention.

At the desired RF frequency, the LC-notch 38, 40 appears as an equivalent inductance ($L_{EQ}$) in series with the parasitic resistance:

$$Z_{LC-NOTCH}(\omega_{RF}) = j\omega_{RF}L_{EQ} + R_{PAR} \quad \text{(Eq. 10)}$$

where $$L_{EQ} = \left(1 - \frac{\omega_{BL,SH}^2}{\omega_{RF}^2}\right)L \quad \text{(Eq. 11)}$$

Assuming the LC-notch resonance frequency is set to attenuate the blocker at $f_{BL,SH}=f_{RX}/2$, $L_{EQ}=3\ L/4$.

At the desired RF frequency, the LNA 36 input resistance is usually designed to match the antenna or generator resistance (usually 50Ω). So as not to disturb the LNA input matching at the RF frequency of interest, $|\omega_{RF}L_{EQ}|>>R_s$ is typically chosen. This also ensures that the desired RF signal does not flow to the LC-notch 38, 40. In other words, a sufficiently large inductance value ($L_{EQ}$ and thus L) is chosen. In some cases, $L_{EQ}=3\ L/4$ may also be used for the LNA 36 input matching purposes at $f_{RX}$, for example tuning out the parasitic capacitance presented at the LNA 36 input.

Losses in the LC-notch 38, 40 degrade the LC-notch-LNA noise factor (NF) compared to what can be achieved with the LNA 36 alone. It can be shown that the LC-notch-LNA NF is given as $$NF_{LC-NOTCH-LNA} = \frac{R_s}{R_P} + NF_{LNA} \quad \text{(Eq. 12)}$$

where $$R_P = \frac{(\omega_{RF}L_{EQ})^2}{R_{PAR}} \quad \text{(Eq. 13)}$$

$NF_{LNA}$ is the LNA NF, and $L_{EQ}$ is given by Eq. 11. If the LC-notch resonance frequency is set to $f_{BL,SH}\ f_{RX}/2$, $L_{EQ}=3\ L/4$.

From Eqs. 12 and 13 it can be seen that in order to minimize the NF penalty due to the LC-notch 38, 40, the notch inductance (L) and Q-factor should be maximized. High-Q inductors offer low parasitic series resistance which minimizes $R_{PAR}$. On the other hand, the maximum inductance value L is set by the LC-notch frequency tuning requirements. Finally, sufficiently wide NMOS switches 52, 54, 56 with low on-resistance should be used in the capacitor tuning matrix 42.

Figure 7:
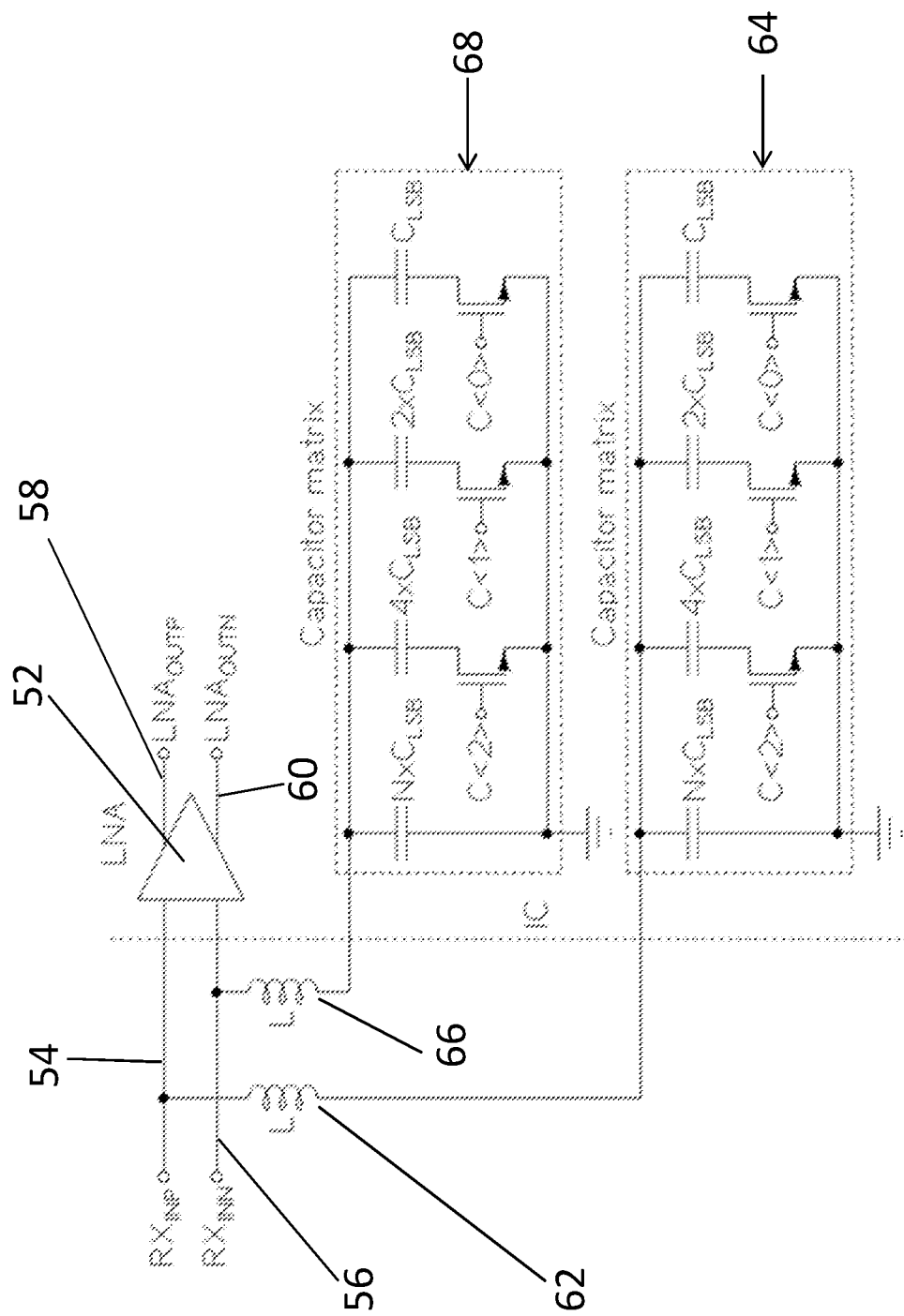
FIG. 7 is a partial schematic diagram of a third embodiment of the invention having a differential amplifier.

FIG. 7 shows another embodiment of the invention. In contrast to the embodiment shown in FIG. 5, in which a configurable LC-notch filter 38, 40 is used in the context of an LNA 36 having single-ended input and output, in this embodiment the LNA 52 has a differential input 54, 56 and output 58, 60. A first notch filter comprising a fixed inductor 62 and a capacitor matrix 64 is connected in parallel with the first LNA input 54 and a second separate notch filter comprising a fixed inductor 66 and a capacitor matrix 68 is connected in parallel with the second LNA input 56. The capacitor matrices 64, 68 are the same as that described with reference to FIG. 5 and will thus not be described again in detail.

Figure 8:
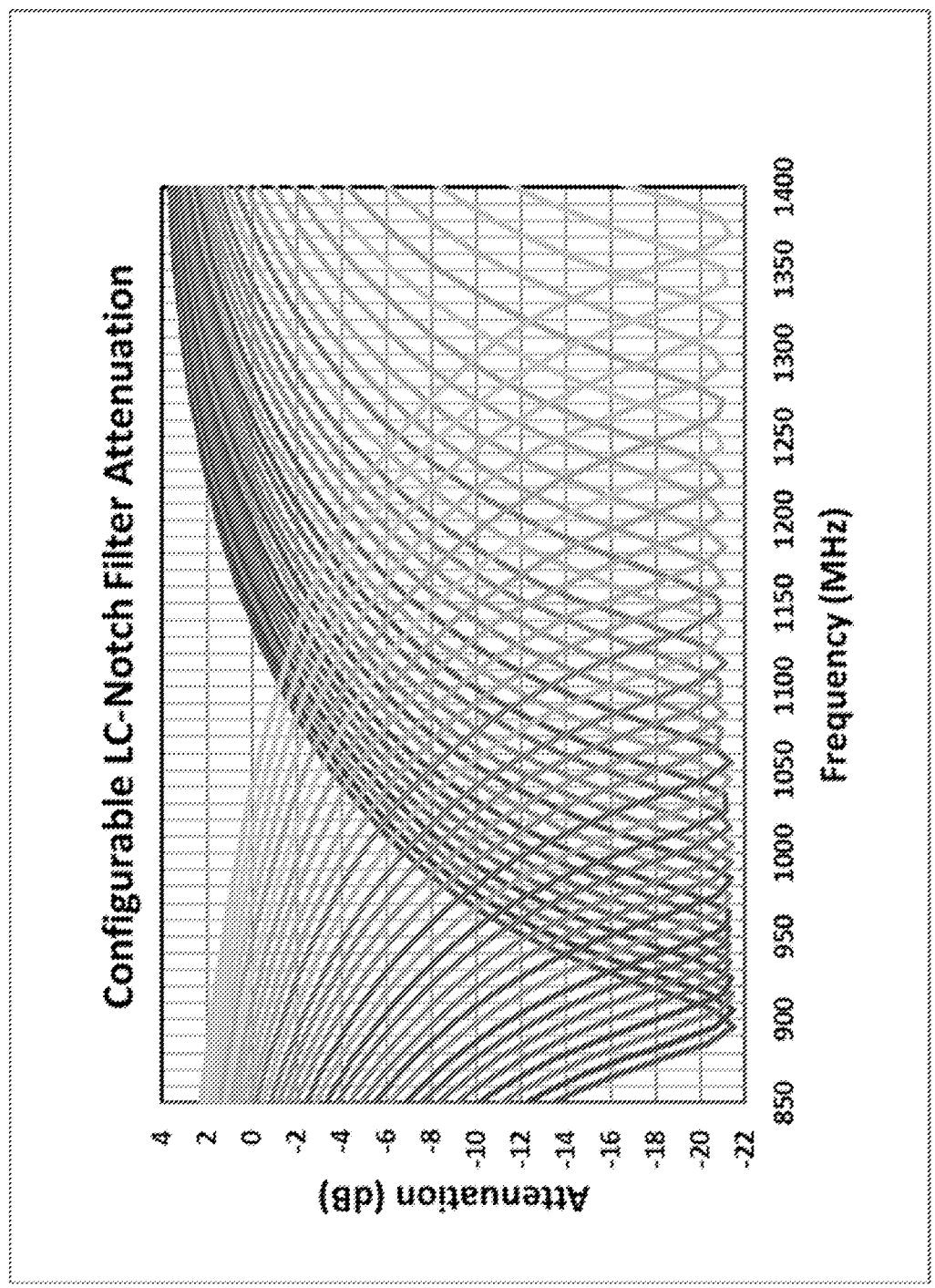
FIG. 8 is a graph of attenuation vs frequency for a configurable LC notch filter in accordance with the invention.

An example of one possible implementation of the invention is shown with reference to FIG. 8 which is a plot of attenuation versus frequency for a configurable LC notch filter employed in an RF pre-selection filter-less radio receiver in accordance with the invention configured for operation at LTE frequency bands between 1800-2700 MHz. In this example the LC-notch filter is designed to filter sub-harmonic blocking signals at half of the desired RF band ($f_{BL,SH}=f_{RX}/2$). Accordingly, the LC-notch filter is configurable around between 900-1350 MHz with some component variation margin. Here, an off-chip inductor is used in the notch filter and the notch capacitance (and frequency) is tuned via a 5-bit capacitor matrix. Accordingly, $2^5=32$ different notch frequencies can be set. The LC-notch filter is connected in parallel with the LNA input in an arrangement similar to that shown in FIG. 5 except for the additional switched capacitors in the capacitor matrix.

The simulated configurable LC-notch filter attenuation (from the antenna to the LNA input) is illustrated in FIG. 8. As shown, the notch tunes between 900-1350 MHz with some margin. In addition, the notch provides around 21 dB attenuation for the sub-harmonic blocking signal at $f_{BL,SH}=f_{RX}/2$. As a result, the antenna-referred second-harmonic power due to the LNA is improved by around 42 dB.

Thus it will be seen that at least in its preferred embodiments, the invention provides a convenient way of allowing potentially harmful sub-harmonic blocking signals to be attenuated without the need to provide multiple RF pre-selection filters and without unduly adding to cost or bills of materials. It will be appreciated that the described embodiments are merely exemplary and that many variations and modifications are envisaged within the scope of the attached claims.

The invention claimed is:

1. A radio frequency receiver comprising:
   an antenna for receiving an RF signal;
   an RF amplifier;
   at least one down-conversion mixer stage arranged to act on signals provided by the RF amplifier and tuned to a tuned frequency $f_t$ selected from a plurality of possible tuned frequencies, said tuned frequency corresponding to a frequency of the RF signal to be received at the antenna; and
   a variable notch filter acting on signals passing from the antenna to the RF amplifier, said variable notch filter having a resonance frequency $f_r$ selected from a plurality of possible resonance frequencies such that $f_r=f_t/n$ where n is a whole number between 2 and 10, the variable notch filter thereby acting to attenuate signals from the antenna at said resonance frequency.

2. The radio frequency receiver as claimed in claim 1, wherein the RF amplifier and the down-conversion mixer stage are provided on an integrated circuit.

3. The radio frequency receiver as claimed in claim 1, wherein the variable notch filter comprises a serial arrangement of an inductance and a capacitance, said serial arrangement being connected between said signal from the antenna and a ground.

4. The radio frequency receiver as claimed in claim 3, wherein the capacitance is also provided on the integrated circuit and the inductance is provided externally of the integrated circuit.

5. The radio frequency receiver as claimed in claim 3, wherein the capacitance is variable.

6. The radio frequency receiver as claimed in claim 5, wherein the capacitance comprises a plurality of discrete capacitor elements, at least some of which can be selectively switched into and out of series with the inductance.

7. The radio frequency receiver as claimed in claim 6, wherein the capacitor elements have different capacitance values and are arranged in parallel such that they can be selectively switched into series with the inductance to give an aggregate capacitance value equal to a sum of the capacitance values of those switched into series.

8. The radio frequency receiver as claimed in claim 7, wherein the capacitor elements have capacitance values which are power-of-two multiples of a base value.

9. The radio frequency receiver as claimed in claim 6, comprising a fixed capacitor to provide a base capacitance value.

10. The radio frequency receiver as claimed in claim 1, wherein the down-conversion stage is arranged to convert a radio frequency input signal directly to a baseband frequency signal.

11. The radio frequency receiver as claimed in claim 1, wherein the amplifier comprises a low noise amplifier.

12. The radio frequency receiver as claimed in claim 1, arranged to be tuneable within a frequency range having a lower end of between 100 and 2000 MHz.

13. The radio frequency receiver as claimed in claim 1, arranged to be tuneable within a frequency range having an upper end of between 1000 and 5000 MHz.

14. The radio frequency receiver as claimed in claim 1, arranged to receive and decode signals conforming to at least one version of the Long Term Evolution (LTE) cellular radio standard.

\* \* \* \* \*